United States Patent [19]

Gotman

[11] 4,404,453
[45] Sep. 13, 1983

[54] LASER BONDING OF MICROELECTRONIC CIRCUITS

[75] Inventor: Alexander Gotman, Santa Monica, Calif.

[73] Assignee: Asta, Ltd., Irvine, Calif.

[21] Appl. No.: 300,991

[22] Filed: Sep. 10, 1981

[51] Int. Cl.$^3$ ............................................... B23K 27/00
[52] U.S. Cl. ........................ 219/121 LD; 219/121 LF
[58] Field of Search ................. 219/121 LC, 121 LD, 219/121 L, 121 LM, 121 EC, 121 ED, 121 EB, 121 EM, 121 LE, 121 LF, 121 LP, 121 LR

[56] References Cited

U.S. PATENT DOCUMENTS

| | | | |
|---|---|---|---|
| 3,480,775 | 11/1969 | Beesley et al. | 219/121 ED |
| 3,614,832 | 10/1971 | Chance et al. | 219/121 LD X |
| 4,250,374 | 2/1981 | Tani | 219/121 LE |
| 4,278,867 | 7/1981 | Tan | 219/121 LC X |

OTHER PUBLICATIONS

Burns, F. & Zyetz, C. "Laser Microsoldering" in *Electronic Packaging and Production,* May 1981, pp. 109–120.

Primary Examiner—C. L. Albritton
Attorney, Agent, or Firm—Gene W. Arant; Paul H. Ware

[57] ABSTRACT

In securing a semiconductor chip to a substrate of ceramic material or the like, a de-focused laser beam having a wave length to which the substrate is substantially opaque is directed over a relatively large area of the reverse side of the substrate. Heat generated at the reverse side of the substrate then flows through the substrate to heat bonding material that is placed between the engaging surfaces of the chip and substrate. In this manner direct heating of the chip is avoided or minimized, and damage to both chip and substrate is also minimized.

6 Claims, 4 Drawing Figures

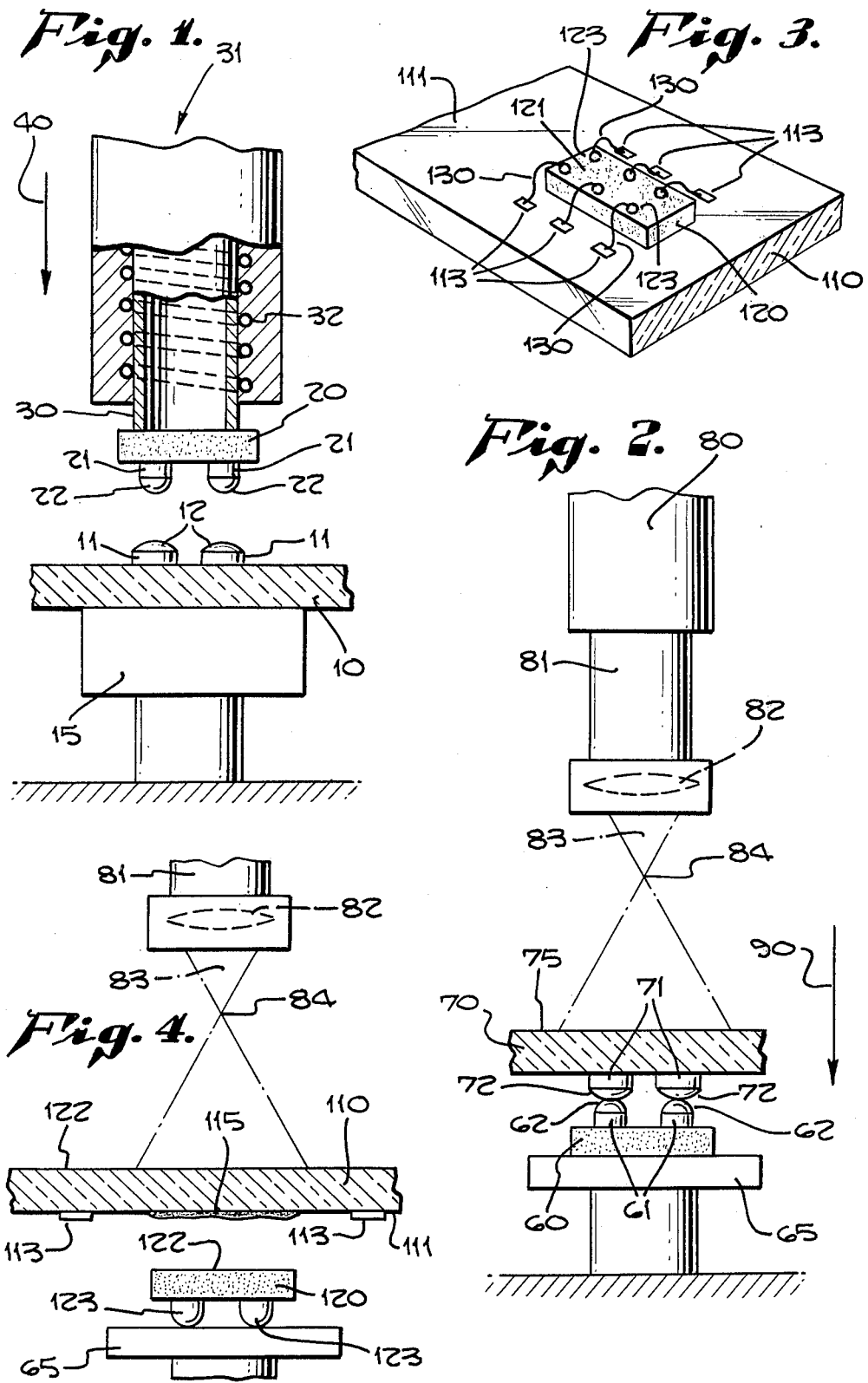

LASER BONDING OF MICROELECTRONIC CIRCUITS

BACKGROUND OF THE INVENTION

In the manufacture of microelectronic circuits it is necessary to attach small components to each other both mechanically and electrically in order to provide desired assemblies. For example, a "chip" may be attached to a substrate or mounting board on which other separate components could also be mounted.

The "chip" is typically a small semiconductor device which internally contains a large number of electronic circuits, but which has a relatively small number of terminals for external connections. For example, the chip may have only two input terminals and two output terminals. The chip is usually constructed in such a way that all of the terminals protrude from one flat surface of the device.

The substrate, or mounting board, is generally of a sheet-like configuration having a thickness of a small fraction of an inch. The substrate is generally integrally formed of a ceramic material. Thin strips or pads of a metallic conductor, such as copper, are secured on one face of the substrate.

In the assembly procedure, a number of chips can be mounted on a single substrate. In hybrid circuits, in addition to the chips, other circuit components such as capacitors and inductance coils may be mounted on the same surface of the substrate with appropriate connections to the conductive strips or pads.

One type of assembly procedure is thermocompression in which both heat and pressure are applied at the same time.

Another type of assembly procedure is known as the flip chip assembly. In this procedure the protruding terminals of each chip are placed in engagement with corresponding conductive strips or pads on the substrate. Some type of soldering technique is then used in order to bond the resulting contact pairs together.

Another assembly procedure is known as wire bonding. In that procedure a portion of the substrate surface that may not carry any conductive strips or pads is provided for securing the chip. Conductive strips or pads are provided in adjacent location on the substrate surface. The protruding terminals of the chip are pointed upwards, away from the substrate. The bottom surface of the chip which carries no terminals is then bonded to the surface portion of the substrate that also is devoid of conductive strips or pads. Then, a short length of wire is used to connect each terminal of the chip to a corresponding one of the adjacent strips or pads on the substrate. Separate solder joints are required at each end of each wire.

PRIOR ART

In the prior art it has been a common practice to apply heat energy direct to the semiconductor device so that it is heated together with its terminals as they are heated and soldered.

In recent years it has become known to utilize a laser beam to facilitate the soldering of microelectronic assemblies. A conventional technique is described, for example, in an article entitled "Laser Microsoldering," by Burns and Zyetz, published in Electronic Packaging and Production magazine May, 1981, at Page 109.

This article describes a wire bonding technique in which a focused laser beam is directed upon each contact pair being soldered. The laser is positioned on the same side of the mounting board as the bonding is to be done. Within the context of this general method the article describes several variations in the manner of applying soldering paste, and in the pretinning and reflowing of the solder.

SUMMARY OF THE INVENTION

According to the present invention a laser beam is used in a novel and unique manner for attaching a semiconductor chip to a substrate. Specifically, the laser beam is deliberately de-focused in order to cover a relatively wide area; and rather than applying the heat energy of the beam directly to the electrical contacts, it is instead applied to the reverse or back side of the substrate. The type of laser beam is selected to have a wave length for which the substrate is substantially, and preferably entirely, opaque. Thus, the incidence of the beam upon the back or reverse side of the substrate causes the light energy to immediately be transformed into heat. A fairly large area of the substrate is heated in a rather uniform fashion, and the heat energy flows through the substrate so as to heat the contact areas being bonded.

An advantage of the invention is that direct heating of the semiconductor device can be entirely avoided, or at least greatly minimized.

Another advantage of the invention is that by heating the substrate over a wide area, with a relatively uniform temperature level, the burning of holes in the mounting board is entirely avoided, and any tendency for the board to crack as the result of uneven thermal expansion is either entirely avoided or greatly minimized.

Therefore, the object and purpose of the present invention is to provide a method of using a laser beam for soldering a semiconductor chip to a substrate, which will be fast and effective, and which will avoid or greatly minimize any damage to the parts being attached together.

DRAWING SUMMARY

FIG. 1 is a schematic illustration of apparatus typically used for soldering a flip chip assembly in accordance with the prior art;

FIG. 2 is a schematic illustration of the apparatus and method according to the present invention, for bonding a flip chip assembly;

FIG. 3 is a fragmentary perspective view of an assembly made in accordance with the wire bonding technique; and FIG. 4 is a schematic illustration of the method and apparatus of the invention for securing a chip to a substrate when the wire bonding type of construction is used.

PRIOR ART

Reference is now made to FIG. 1 illustrating a typical apparatus and method for flip chip assembly in accordance with the prior art. A mounting board or substrate 10 made of ceramic or other suitable material is supported in a fixed position. Conductive strips or pads of metal 11 are secured to its upper surface. The pads or strips are pretinned with solder globules 12. A member 15 which supports the substrate or circuit board 10 from its underside is also used as a means for preheating the board. The purpose of the preheating is to raise the temperature of the board somewhat so that, during the soldering operation, when temperature peaks occur at the interengaged contact pairs that are being soldered, the risk of producing thermal cracks in the mounting board will be minimized.

A chip 20 is suspended above the mounting board 10. On its undersurface it has a plurality of protruding terminals 21. Each terminal 21 is pretinned with a solder globule 22. A vertically extending tube 30 has vacuum force applied to its upper end 31, and the lower end of the tube engages the upper flat surface of the chip 20 in order to support and manipulate the chip. An electrical heating coil 32 surrounds the tube 30 in good heat conductive relationship thereto. Heat which is produced by the heating coil flows through the lower end of the tube 30 into the chip 20. It then flows to the terminals 21 and solder globules 22.

As indicated by arrow 40, the chip 20 is moved downward until its terminal 21 engage the pads or strips 11 of the mounting board 10. The preferred technique is to heat the chip sufficiently so that its solder globules 22 will become partially liquified before the contact occurs. Thus, the liquified globules 22 will flow around the convex upper surfaces of the still solid globules 12 on the substrate. Continued heat flow then results in the melting of the globules 12, thus producing effective fusion between contact pairs 21, 11.

It should be noted that in accordance with the prior art method as shown in FIG. 1, the heat needed for bonding is applied directly to the chip. This creates a possibility of damage to the semiconductor device.

The referenced article by Burns and Zyetz describes and illustrates a prior art technique for wire bonding a chip to a substrate. A coherent laser beam is directed at each end of each wire to provide the necessary heat for soldering it.

THE INVENTION

Flip Chip Assembly

Reference is now made to FIG. 2 illustrating the apparatus and method of the present invention for flip chip assembly.

A chip 60 is supported in a fixed position upon a base 65. Terminals 61 of the chip 60 protrude from its upper surface and are capped by solder globules 62.

Some distance above the fixed support 65 a laser 80 with a suitable wave length is positioned. From its lower end an optical tube 81 conveys the laser beam to a lens 82, which may for example be made of germanium. The lens 82 focuses the beam 83 at a focal point 84 which is a relatively short distance below the lens.

A substrate 70 is horizontally positioned at a much greater distance beneath the lens 82. Conductive strips or pads 71 are secured to the lower surface of the substrate, and so positioned as to receive terminals 61 of the chip. The strips or pads bear solder globules 72. The back or rear surface 75 of the substrate faces upward where it receives the beam 83.

The distance of the substrate 70 beneath the focal point 84 is intentionally made greater than the focal length of the lens itself. Thus, the beam where it impinges upon the substrate is deliberately de-focused so that it covers a relatively wide area. Specifically, the surface area 75 is struck by the beam is sufficiently large to encompass all of the contact strips or pads 71 which are supposed to be engaged with the chip that is to be bonded.

The substrate 70 is typically made of a ceramic material such as aluminum oxide, $Al_2O_3$. Laser 80 is therefore selected to have a wave length to which the substrate is substantially, or preferably entirely opaque. For example, the laser may be of the $CO_2$ type with a wave length of 10.6 microns. As a result, all of the light energy in the beam is converted to heat upon striking the rear surface 75 of the substrate.

The method of the present invention is carried out as follows. After their initial manufacture, both the chip 60 and the substrate 70 are pretinned. That is, solder globules 62 are added to terminals 61 of the chip, and solder globules 72 are added to the conductive strips or pads 71 of the substrate.

Substrate 70 is initially positioned so that it is elevated slightly above the position shown in FIG. 2. That is, it is not in immediate contact with the chip. Laser 80 is energized so that the rear or upper surface 75 of the substrate will be heated. The application of heat is continued for a sufficient time so that the solder globules 72 carried at the lower extremity of the substrate will become partially liquified. With typical operating parameters the time required for this heating action to occur is a small fraction of one second.

Then the substrate 70 is moved downward in the direction shown by arrow 90 so that the contact pairs will come into engagement. Operation of the laser is continued during this time. Each of the liquified solder globules 72 will then modify its shape so as to conform to the convex upper surface of the rigid solder globule 62. Then the solder globules on the chip become melted and fusion takes place.

It will be understood that in accordance with the invention heat is conducted into terminals 61 through the solder globules 72, 62.

To complete the bonding action, the energy supply for laser 80 is turned off so as to interrupt the beam. Cooling of the soldered contact pairs may then take place as a normal time function in response to the ambient atmosphere, or if desired, it may be accelerated by blowing a cool stream of inert gas laterally between the chip 60 and substrate 70.

While specific details of the construction and operation of the laser 80 are not set forth here, it will be understood that they are well known in the art, and that the present invention is not directed to the laser per se, but rather to the purpose for which it is used and the manner in which that purpose is achieved.

While the substrate 70 may typically be of a ceramic material, it may also be made of sapphire if desired, and the method of the invention is still carried out in the same manner and achieves the same result.

The laser 80 is the main source of heat energy for accomplishing the soldering reflow action, but an auxiliary heat source may also be used if that is desired. The auxiliary heat source is then applied to the support 65 of the chip 60, preheating the chip somewhat so that the amount of additional heat required to liquify the solder globule 62 will be reduced.

WIRE BONDING

Reference is now made to FIGS. 3 and 4 which illustrate the method of the present invention for attaching a chip to a substrate, when the wire bonding technique is being employed.

FIG. 3 is a perspective view of a circuit assembly utilizing the conventional wire bonding type of construction. A substrate 110 has a chip 120 resting upon, and secured to a portion of its upper surface. The upper surface 111 of the substrate also carries a number of conductive strips or pads 113, which are in locations adjacent to the chip 120. Chip 120 has a number of terminals 123 protruding from its upper surface 121. Each terminal 123 of the chip is connected to an associated pad 113 of the substrate by means of a corresponding wire 130. Although not readily apparent from FIG. 3, both ends of the wire 130 are soldered, one end being soldered to the chip terminal 123 while the other end is soldered to the substrate pad 113.

According to conventional technology the back side 122 of chip 120, which carries no terminals, must be bonded to an area of surface 111 of the substrate 110 which may or may not carry conductive strips or pads. The present invention provides a novel method of securing these two members together to form an integral structure.

The base 65, light tube 81, and lens 82 shown in FIG. 4 are the same apparatus as previously described in conjunction with FIG. 2. The substrate and the chip, however, are positioned differently, and are secured together in a different relationship.

Thus the chip 120 is placed upon the supporting base 65 with its terminals 123 resting upon the base. Its reverse or back surface 122 faces upward.

The substrate 110 is placed in a slightly elevated position above the chip. The upper surface 111 of the substrate faces downward towards the chip. Conductive strips or pads 113 are fastened in two rows upon the upper surface 111 (which now faces downwardly), one row of these pads being on either side of the chip 120. Immediately above the chip is that portion of the surface area of the substrate which is to receive the chip. That surface area is covered with a eutectic alloy or epoxy or other appropriate bonding agent 115.

As in the embodiment of FIG. 2, the substrate is positioned far enough below the lens 82 so that it is considerably beyond the focal point 84 of the lens. Thus, the laser beam 83 is de-focused before it strikes the substrate. Consequently, the laser beam heats the substrate in a uniform fashion over quite an extended area, which fully encompasses that portion of the opposite surface of the substrate that is covered by the bonding agent 115, and to which the chip is to be secured.

The laser beam is energized while the substrate is spaced above the chip in the position shown in FIG. 4. Thus, an initial heating action is imparted to the substrate and to the bonding material 115. Then the substrate is lowered until it engages the chip, and during this time the heating action of the laser beam is continued. When the fusion of the bonding material has been completed, the laser beam is turned off, and a cooling action is applied to both the chip and the substrate, for example, by blowing an inert cool gas upon them.

It is preferred to apply the bonding material 115 to the substrate 110 as shown in FIG. 4, but if desired an additional layer of bonding material may be applied to the upper surface 122 of chip 120. Alternatively although not preferred, the bonding material may be applied entirely to the chip rather than to the substrate.

The invention has been described in considerable detail in order to comply with the patent laws by providing a full public disclosure of at least one or its forms. However, such detailed description is not intended in any way to limit the broad features or principles of the invention, or the scope of patent monopoly to be granted.

What is claimed is:

1. The method of attaching a semiconductor chip to a substrate to form an electrical assembly, comprising the steps of:
   (a) selecting a semiconductor chip having a plurality of metallic electrical connectors protruding therefrom;
   (b) selecting a substrate having a substantially sheet-like configuration;
   (c) selecting a plurality of conductive metallic members and securing them in such locations on one surface of the substrate as to receive respective connectors of the chip;
   (d) then tinning both the connectors of the chip and the metallic members of the substrate;
   (e) generating a laser beam having a wave length to which the substrate is substantially opaque;
   (f) de-focusing the laser beam;
   (g) then directing the de-focused laser beam upon the opposite surface of the substrate throughout an area which encompasses all of the metallic members, so as to heat the substrate and thereby heat the metallic members;
   (h) then, while continuing to direct the de-focused laser beam upon the substrate, moving the chip and the substrate together so as to bring each electrical connector of the chip into contact with the corresponding metallic member of the substrate;
   (i) continuing to direct the beam upon the substrate until the tinned surface of each electrical connector becomes fused to the tinned surface of the associated metallic member; and
   (j) then interrupting the laser beam and cooling both the chip and the substrate so that the fused contacts become permanently bonded together.

2. The method of claim 1 wherein said substrate is selected of ceramic material, aluminum oxide, and the laser beam has a wave length of 10.6 microns.

3. The method of claim 1 wherein said substrate is selected of sapphire, and the laser beam has a wave length of 10.6 microns.

4. The method of claim 1 wherein the chip is supported in a fixed position with its electrical connectors extending upwardly, a laser is positioned above the chip to direct the laser beam downwardly toward the chip, the substrate is interposed between the beam and the chip with its conductive pads on its lower surface, and the substrate is moved downwardly toward the chip after the generation of the laser beam has been initiated.

5. The method of attaching a semiconductor chip to a substrate to form an electrical assembly, comprising the steps of:
   (a) selecting a semiconductor chip having a front surface from which a plurality of metallic electrical connectors protrude, and a back surface with no connectors;
   (b) selecting a substrate having a substantially sheet-like configuration, and having a front surface with an area upon which the chip is to be attached;
   (c) placing a bonding material on either the back surface of the chip or said front surface area of the substrate;
   (d) generating a laser beam having a wave length to which the substrate is substantially opaque;
   (e) de-focusing the laser beam;
   (f) then directing the de-focused laser beam upon the back surface of the substrate throughout an area which encompasses all of said front surface area;

(g) then, while continuing to direct the de-focused laser beam upon the substrate; moving the chip and the substrate together so as to bring the back surface of the chip into contact with said front surface area of the substrate;

(h) continuing to direct the beam upon the substrate until the engaging surfaces of the chip and substrate become fused together; and (i) then interrupting the laser beam and cooling both the chip and the substrate so that the fused surfaces beome permanently bonded.

6. In the art of forming an electrical assembly by securing a semiconductor chip to a substrate, the method of bonding the chip and the substrate together, comprising the steps of:

(a) selecting a semiconductor chip;

(b) selecting a substrate of generally sheet-like configuration having two substantially parallel surfaces on one of which the chip is to be attached;

(c) applying a bonding material to at least one of said chip and substrate;

(d) generating a laser beam having a wave length to which the substrate is substantially opaque;

(e) de-focusing the laser beam;

(f) directing the de-focused laser beam upon the other surface of the substrate so as to heat the substrate including said one surface thereof;

(g) while continuing to direct the de-focused laser beam upon the substrate; moving the chip and the substrate into contact with each other so that the heat from the substrate will flow into and through said bonding material and into the surface of the chip; and (h) when the chip and the substrate have become fused together, interrupting the laser beam and cooling both the chip and the substrate so that they are thereafter permanently bonded together.

* * * * *